(12) United States Patent
Collins et al.

(10) Patent No.: US 9,219,204 B1
(45) Date of Patent: Dec. 22, 2015

(54) SEMICONDUCTOR DEVICE AND A METHOD OF MAKING A SEMICONDUCTOR DEVICE

(71) Applicant: Rayvio Corporation, Hayward, CA (US)

(72) Inventors: Douglas A. Collins, Cambridge, MA (US); Faisal Sudradjat, Cambridge, MA (US); Robert C. Walker, Emerald Hills, CA (US); Yitao Liao, Sunnyvale, CA (US)

(73) Assignee: RAYVIO CORPORATION, Hayward, CA (US)

( * ) Notice: Subject to any disclaimer, the term of this patent is extended or adjusted under 35 U.S.C. 154(b) by 43 days.

(21) Appl. No.: 14/205,259

(22) Filed: Mar. 11, 2014

Related U.S. Application Data

(60) Provisional application No. 61/776,757, filed on Mar. 11, 2013.

(51) Int. Cl.
| | |
|---|---|
| *H01L 33/00* | (2010.01) |
| *H01L 33/58* | (2010.01) |
| *H01L 33/14* | (2010.01) |
| *H01L 33/32* | (2010.01) |
| *H01L 33/38* | (2010.01) |
| *H01L 33/06* | (2010.01) |
| *H01L 33/24* | (2010.01) |

(52) U.S. Cl.
CPC .............. *H01L 33/58* (2013.01); *H01L 33/007* (2013.01); *H01L 33/0075* (2013.01); *H01L 33/06* (2013.01); *H01L 33/14* (2013.01); *H01L 33/24* (2013.01); *H01L 33/32* (2013.01);
(Continued)

(58) Field of Classification Search
CPC ................... H01L 21/02521; H01L 21/02546; H01L 21/02579; H01L 21/0262; H01L 21/02642; H01L 21/02647; H01L 33/007; H01L 33/641; H01L 21/0237; H01L 21/0242; H01L 21/02458; H01L 33/36; H01L 33/64; H01L 21/0254; H01L 25/0753; C09K 11/0883; C09K 11/7721; C09K 11/7734; C09K 11/7739; C09K 11/7774
USPC .......... 257/12–13, 40, 81, 84, 87–89, 98–100, 257/347–348, 433–434; 313/112, 501, 503, 313/506–507
See application file for complete search history.

(56) References Cited

U.S. PATENT DOCUMENTS 6,872,981 B1 * 3/2005 Horiuchi et al. ................ 257/77
7,498,182 B1    3/2009 Sampath et al.
(Continued)

OTHER PUBLICATIONS

Jmerik et al., "AlGaN-based Quantum-Well Heterostructures for Deep Ultraviolet Light-Emitting Diodes Grown by Submonolayer Discrete Plasma-assisted Molecular-Beam Epitaxy", Semiconductors, 2008, pp. 1420-1426, vol. 42, No. 12, Pleiades Publishing, Ltd.

*Primary Examiner* — Dung Le
(74) *Attorney, Agent, or Firm* — Richard T. Ogawa; Ogawa P.C.

(57) ABSTRACT

The present invention provides an LED device capable of emitting electromagnetic radiation ranging from about 200 nm to 365 nm and a method. The device has a substrate member, the substrate member being selected from sapphire, silicon, quartz, gallium nitride, gallium aluminum nitride, or others and an active region overlying the substrate region. The active region comprises a light emitting spatial region comprising a p-n junction and characterized by a current crowding feature of electrical current provided in the active region. The device has an optical structure spatially disposed separate and apart the light emitting spatial region and is configured to facilitate light extraction from the active region.

32 Claims, 15 Drawing Sheets

Device Cross-section

(52) U.S. Cl.
CPC ........ *H01L 33/38* (2013.01); *H01L 2933/0016* (2013.01); *H01L 2933/0058* (2013.01)

(56) References Cited

U.S. PATENT DOCUMENTS

| | | |
|---|---|---|
| 2005/0230701 A1 | 10/2005 | Huang |
| 2007/0075307 A1 | 4/2007 | Yoon et al. |
| 2008/0157102 A1 | 7/2008 | Hori et al. |
| 2009/0206320 A1 | 8/2009 | Chua et al. |
| 2009/0302308 A1 | 12/2009 | Chua et al. |
| 2009/0309110 A1* | 12/2009 | Raring et al. .................. 257/89 |
| 2010/0270532 A1 | 10/2010 | Takano et al. |
| 2012/0043552 A1* | 2/2012 | David et al. .................... 257/76 |

\* cited by examiner

- Model absorption was a free parameter to match data
- 400/cm corresponds to ~85% transmission through 4 um of AlN/AlGaN

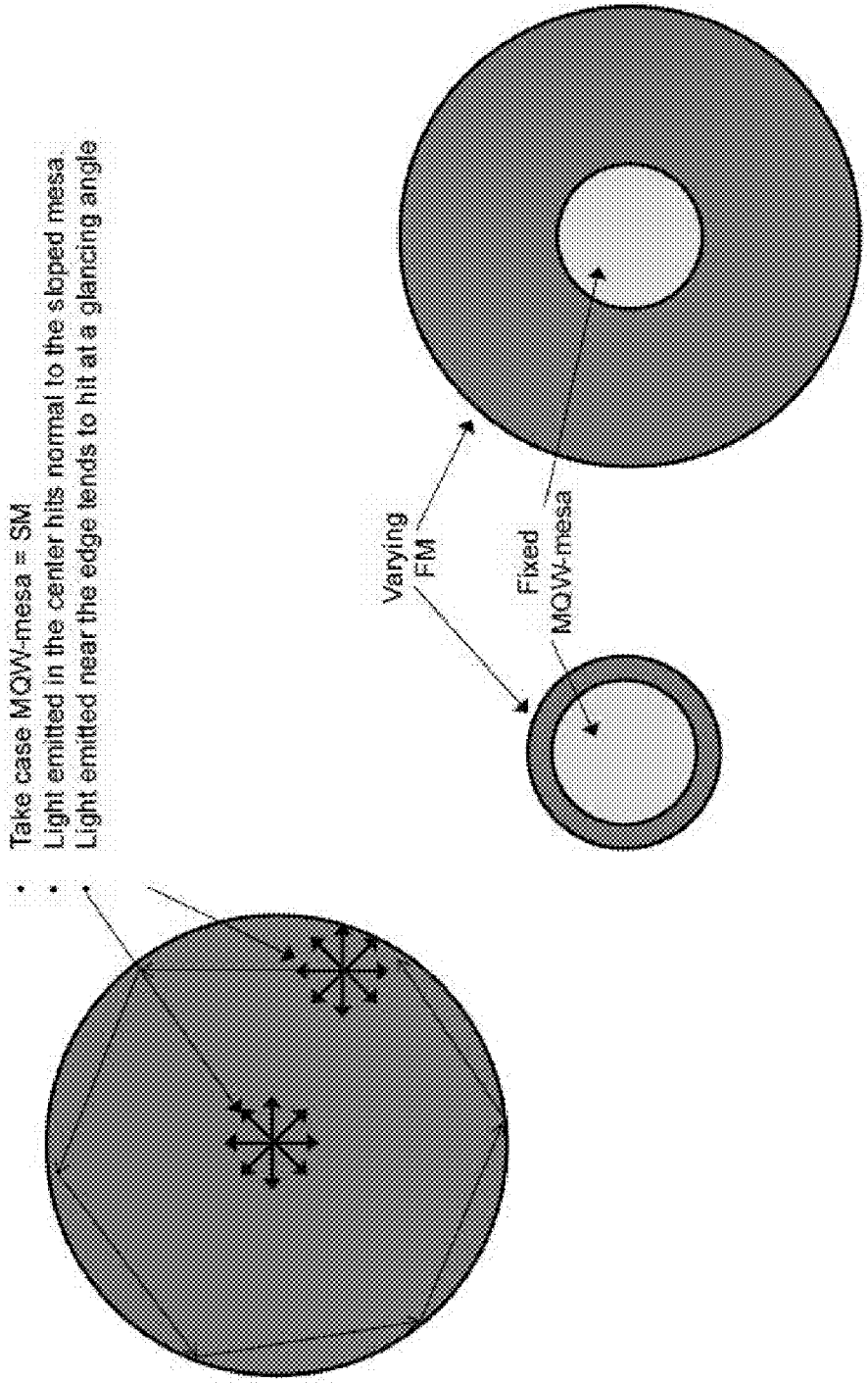

SEMICONDUCTOR DEVICE AND A METHOD OF MAKING A SEMICONDUCTOR DEVICE

CROSS REFERENCE TO RELATED APPLICATIONS

This application claims priority to U.S. Provisional Application No. 61/776,757 filed Mar. 11, 2013, commonly assigned, and hereby incorporated by reference herein.

BACKGROUND

The bandgap of III-nitride materials, including (Al, Ga, In)—N and their alloys, extends from the very narrow gap of InN (0.7 eV) to the very wide gap of AlN (6.2 eV), making them highly suitable for optoelectronic applications such as light emitting diodes (LEDs), laser diodes, optical modulators, and detectors over a wide spectral range extending from the near infrared to the deep ultraviolet. Visible light LEDs can be obtained using InGaN in the active layers, while ultraviolet (UV) LEDs require the larger bandgap of AlGaN.

Visible spectrum LEDs based on InGaN and AlInGaP systems have reached maturity and are now in mass production. However, the development of UV LEDs is still hampered by a number of difficulties involving basic material properties of AlGaN alloys, especially those with high Al content. Compared to LEDs in the visible spectral range with external quantum efficiency (EQE, the ratio of extracted photons to injected electron-hole pairs) of more than 50%, deep UV LEDs, such as those emitting below 300 nm, have an EQE of only up to 1%.

UV LEDs with emission wavelengths in the range of 230-350 nm are expected to find a wide range of applications, most of which are based on the interaction between UV radiation and biological material [Khan et al., 2008]. Typical applications include surface sterilization, water purification, medical devices and biochemistry, light sources for ultra-high density optical recording, white lighting, fluorescence analysis, sensing, and zero-emission automobiles. Although under extensive research for many years, UV LEDs, especially those emitting below 300 nm, remain extremely inefficient when compared to their blue and green counterparts. For example, Hirayama et al. recently reported 10.5 mW single-chip LED operation at 282 nm and peak EQE of 1.2% [Hirayama et al., 2009].

The growth of III-nitrides onto the c-plane sapphire is well-established. However, III-nitride material grown on c-plane sapphire suffers from the presence of polarization fields due to the polar nature of crystal bonds, which lead to energy band bending and reduction of recombination efficiency in quantum heterostructures due to physical separation of electron-hole wave functions, commonly known as the Quantum Confined Stark Effect (QCSE). Due to lattice mismatch, III-nitride materials grown on sapphire suffer from a high density of defects such as dislocations and inversion domains. A number of methods have been developed to obtain high quality single crystal material for device applications, including optimization of the nucleation process and choice of buffer layers to accommodate lattice mismatch. Alternative substrates, such as (001) Si, lithium aluminum oxide ($LiAlO_3$) and silicon carbide (SiC) of various crystallographic planes also have been used for certain applications. However, native GaN and AlN substrates are still under development and remain prohibitively expensive.

SUMMARY

The present invention provides methods for fabricating UV LEDs of high efficiency and high output, and emitting over the range from 200 nm to 365 nm, for use in water purification, surface sterilization, communications, information storage and retrieval, epoxy curing, medical therapy, and a variety of electronic devices.

In an example, the present invention provides an LED device capable of emitting electromagnetic radiation ranging from about 200 nm to 365 nm, the device. The device includes a substrate member, the substrate member being selected from sapphire, silicon, quartz, gallium nitride, gallium aluminum nitride, or others. The device has an active region overlying the substrate region, the active region comprising a light emitting spatial region comprising a p-n junction and characterized by a current crowding feature of electrical current provided in the active region. The light emitting spatial region is characterized by about 1 to 10 microns. The device includes an optical structure spatially disposed separate and apart the light emitting spatial region and is configured to facilitate light extraction from the active region.

In an example, the present method and device can include one or more of the following elements:
a) a light emitting region, where light is generated in the device;
b) an optical cavity, where light can be trapped in the device;
c) light emission surface(s), where light is extracted from the device;
d) a light extract structure, which causes light which is trapped in the optical cavity and is not being directed towards the light emission surface(s), and causes it to change direction towards the light emission surface(s) in such a way that it can be extracted form the device.

In an example, the present method and structure increases the light extraction of the device, leading to higher power, efficiency, and lower cost/watt of optical output power. A benefit of the structure is that the optical cavity where the light is trapped is removed from the emission region which strongly absorbs the light.

In an example, the present invention provides a method for fabricating an LED device capable of emitting electromagnetic radiation ranging from about 200 nm to 365 nm. The method includes providing a substrate member, the substrate member being selected from sapphire, silicon, quartz, gallium nitride, gallium aluminum nitride, or others. The method includes forming an active region overlying the substrate region, the active region comprising a light emitting spatial region comprising a p-n junction and characterized by a current crowding feature of electrical current provided in the active region. The method also includes forming an optical structure spatially disposed separate and apart the light emitting spatial region and is configured to facilitate light extraction from the active region. Preferably, the forming of the active region comprises growing multiple thicknesses of epitaxial material to form a thickness having a surface region; forming a mask overlying the surface region, while exposing a portion of the surface region; and removing the exposed portion of the thickness such that a remaining structure of a portion of the thickness is narrower than a length of the surface region.

Various benefits are achieved over pre-existing techniques using the present invention. In particular, the present invention enables a cost-effective UV LED using conventional processes. Depending upon the embodiment, the present apparatus and method can be manufactured using conventional materials and/or methods according to one of ordinary skill in the art. In one or more embodiments, the optical device has a much higher light extraction efficiency. Of course, there can be other variations, modifications, and alternatives. Depending upon the embodiment, one or more of these benefits may be achieved. These and other benefits may be described throughout the present specification and more particularly below.

The present invention achieves these benefits and others in the context of known process technology. However, a further understanding of the nature and advantages of the present invention may be realized by reference to the latter portions of the specification and attached drawings.

BRIEF DESCRIPTION OF THE DRAWINGS

FIG. 15 illustrates an effect of sloped mesa to MQW-mesa distance according to an embodiment of the present invention.

DETAILED DESCRIPTION OF THE SPECIFIC EMBODIMENTS

Figure 1:
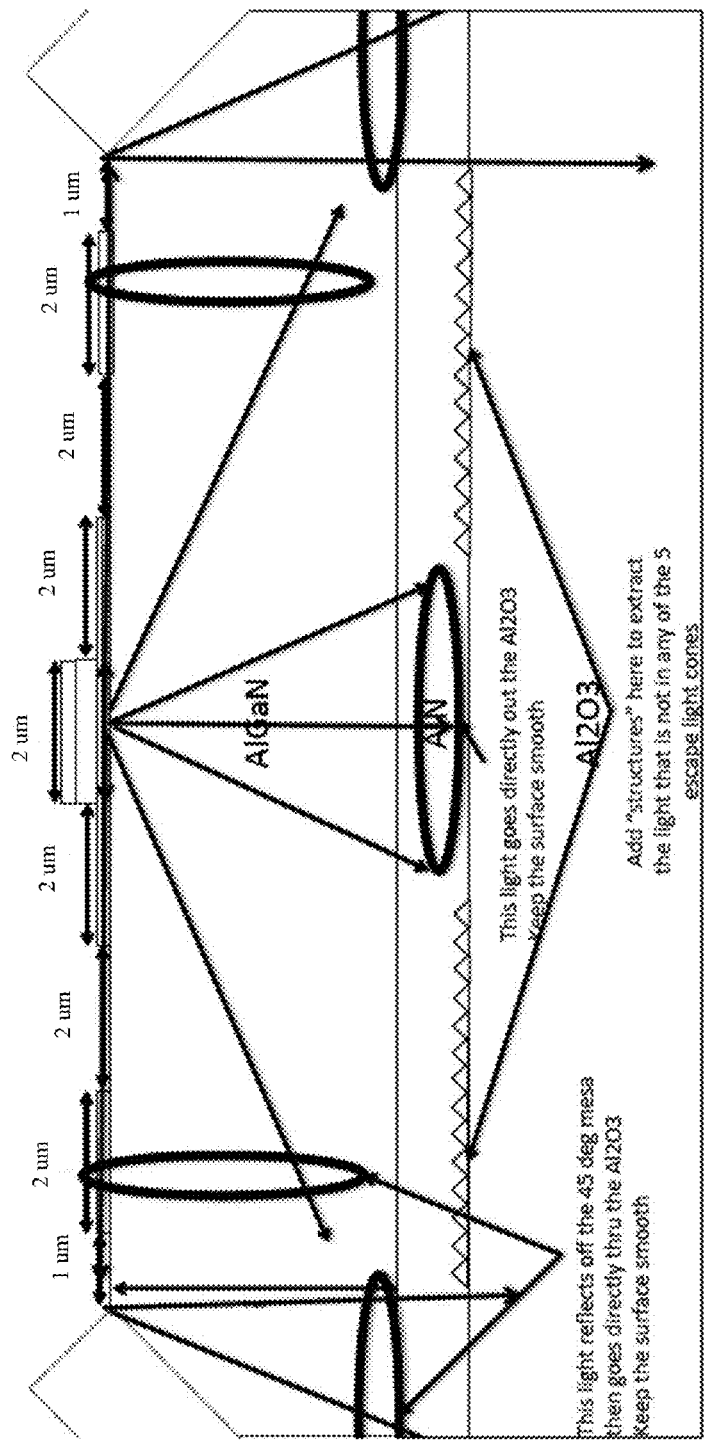
FIG. 1 is a simplified diagram illustrating an LED device according to an embodiment of the present invention.

The present inventors have developed methods for fabricating LEDs emitting in the ultraviolet range that avoid many of the difficulties associated with such devices up to now.

As background, visible LEDs use a variety of light extraction techniques to get the light out of the relatively high index of refraction (IoR) semiconductor layers (>2) and to the relatively low index of refraction air (~1), avoiding the problem of having much of the light trapped inside the semiconductor layers due to total internal refraction at the high/low IoR interfaces. These can include: a) surface roughening; b) surface features (such as pyramids or other structures); c) reflective electrical contacts; d) mirrors on various surfaces (top, side, bottom), e) backside lenses in the transparent substrate material (e.g. sapphire); f) features or roughening of the substrate surface (which leads to light scattering at the semiconductor/substrate interface); g) "chip shaping" in the case of large, transparent chips (making the side walls non-perpendicular to the top and bottom surfaces of the chip). The light will frequently have some probability of being trapped in the device and, through use of these features, can be scattered and returned to an edge and potentially get extracted after multiple attempts ("bounces").

Ultraviolet LEDs have proposed some of these techniques, but have their own challenges; in particular, a) the use of absorbing p-type GaN as a p-contact material on the epitaxial wafer, which strongly absorbs the UV light; b) the possible existence of absorbing n-type metal ohmic contacts, which also further absorb light in the device. These challenges lead to the light being absorbed quickly in the device, and reduces the efficacy of scattering the light in the hopes of extracting it after multiple bounces.

Methods according to the invention can be used to make devices for use in water purification, surface sterilization, communications, information storage and retrieval, epoxy curing, medical therapy, and a variety of electronic devices. They are especially useful for making LEDs, including UV LEDs. The also can be used to produce optoelectronic emitters made from intrinsic semiconductor multiple quantum well structure combined with an external excitation device, including but not limited to photon excitation and electron beam excitation. In the area of sterilization, purification, and biological research, the methods and devices of the invention can be used in dermatology, biosensors, blood and serum analysis, DNA sequencing and microarrays (including nucleic acid and protein microarray systems), microscopy and imaging, corneal treatment, toothbrush sterilization, photo-deodorization of air, maskless lithography, detecting and killing bacteria, and general decontamination. In the areas of military, homeland security, and agriculture, the methods and devices of the invention can be used for currency validation, anthrax detection, passport and ID control, forensic investigations, machine vision, insect vision manipulation, and insect attraction. In the areas of industry and hobby or sporting uses, the methods and devices of the invention can be used for inks, adhesives, coatings, encapsulants, scorpion detection, fishing lures, aquarium lighting, mineral and coral fluorescence, die tracing, leakage detection, and spectrofluorimetry.

FIG. 1 is a simplified diagram illustrating an LED device according to an embodiment of the present invention. In an example, light is created in the current path in the p-n junction area directly under the p-contact metal and p-GaN. Some of the light created can directly escape from the relatively high index (n~2.5) AlGaN material into the relatively low index (for example, n~1.0 for air, or n~1.5-1.8 for quartz or sapphire) material surrounding the AlGaN LED emitting material. In this embodiment, light going perpendicular to the direction of the p-n junction and away from the p-GaN contact can escape into the sapphire substrate and subsequently into the air (the size of this cone is approximately +/−24 degrees, and constitutes approximately 4.2% of the total solid angle of the created light). Similarly, light emitted roughly within the plane of the p-n junction area is trapped within the AlGaN layers, until it reaches: a) either a perpendicular edge, where it can escape; or, b) a sloped edge where it is reflected into a different direction, towards a difference edge (the bottom of the Al2O3 substrate, in this embodiment), where is subsequently escapes. However, a significant % of the light generated is not contained in these escape cones, and is trapped in the AlGaN layers. Light emitting structures can be added, for example, to the Al2O3/AlGaN interface, or surface features or roughening, to scatter or redirect this trapped light to allow it to escape the chip. Due to the relatively concentrated size of the light generation area in the relatively small p-n junction area, and the relatively large size of the total optical cavity, these structures do not need to be added to those regions of the interfaces where light can directly escape (where they would interfere with the light extraction), and can be added to only those regions where they only scatter/affect the light that is trapped in the AlGaN layers. Further details of the present invention can be found throughout the present specification and more particularly below.

Figure 2:
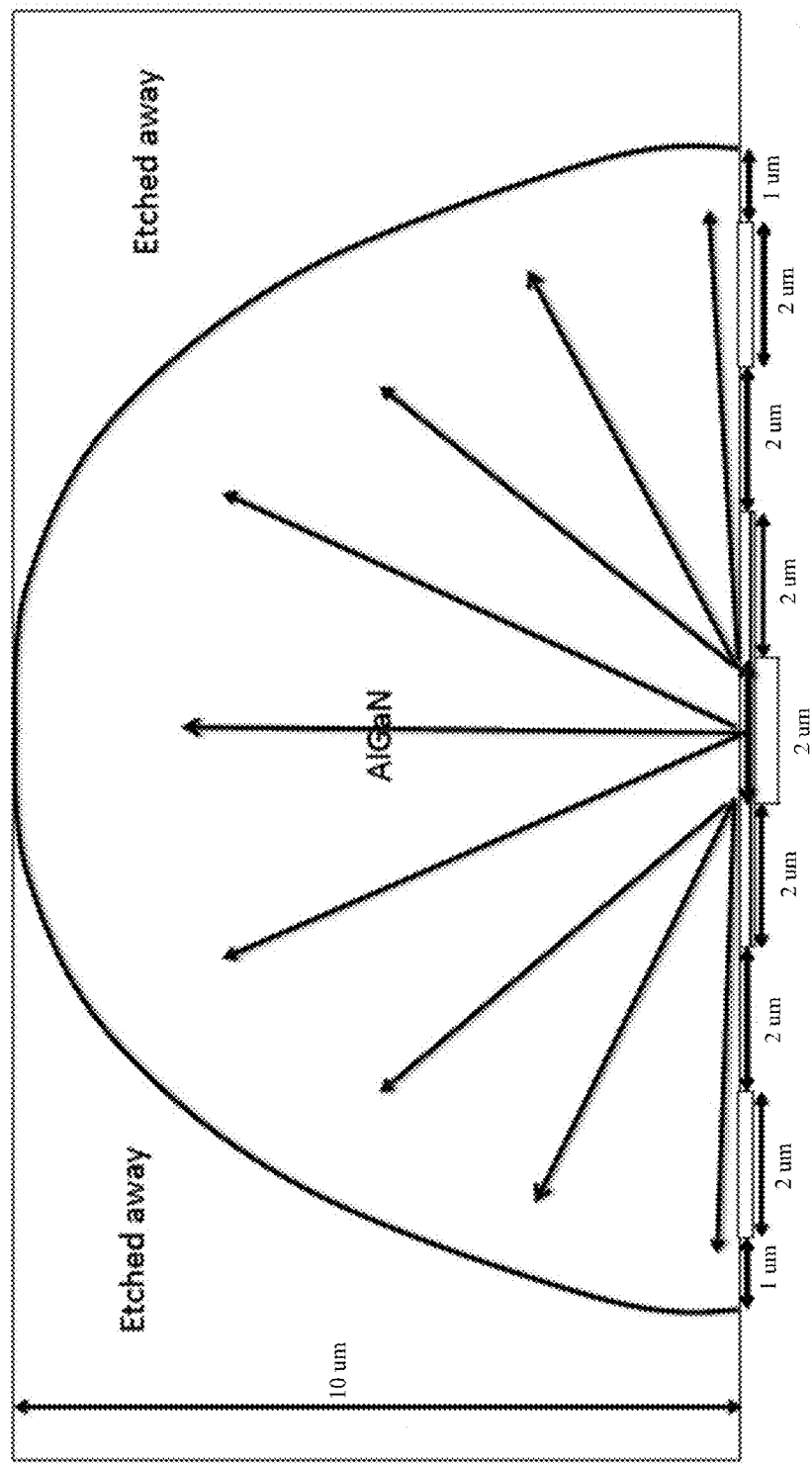
FIG. 2 is a simplified diagram illustrating an LED device according to an embodiment of the present invention.

FIG. 2 is a simplified diagram illustrating an LED device according to an embodiment of the present invention. In this embodiment, the p-n junction and LED epitaxial structure is initially deposited on an AlGaN layer, which is on a semiconductor substrate, such as Al2O3, a relatively narrow (~few microns) and short (~few 10 s of microns) p-n junction area is defined by lithographically defining the p-GaN and p-metal size. The structure is then bonded, p-side down, to a new substrate, and the semiconductor substrate is removed. The AlGaN material, or additional materials of similar optical index of refraction to the AlGaN that are subsequently added, can then be shaped into a lens. Due to the relatively small size of the electrically active area where the light is created in the p-n junction, and the relatively large size of the optical cavity, a significant fraction of the light emitted at the p-n junction will be close enough to normal incidence at the edge of the lens to be able to escape from the relatively high index AlGaN material to the relatively low index material surrounding it. A single LED device could be made up of an array of this relatively small "microLEDs" that would be electrically connected together.

Figure 3:
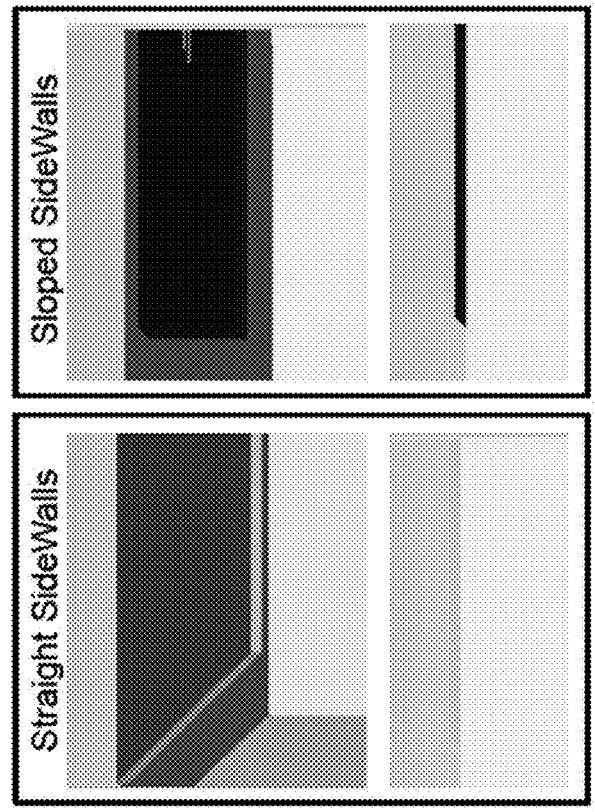
FIG. 3 is a simplified diagram illustrating an LED device according to an alternative embodiment of the present invention.
Figure 3:
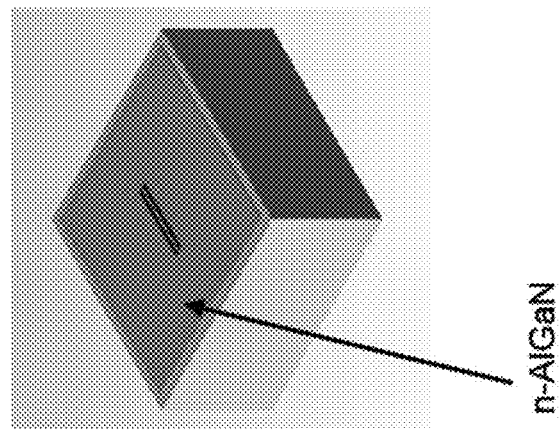
Figure 4:
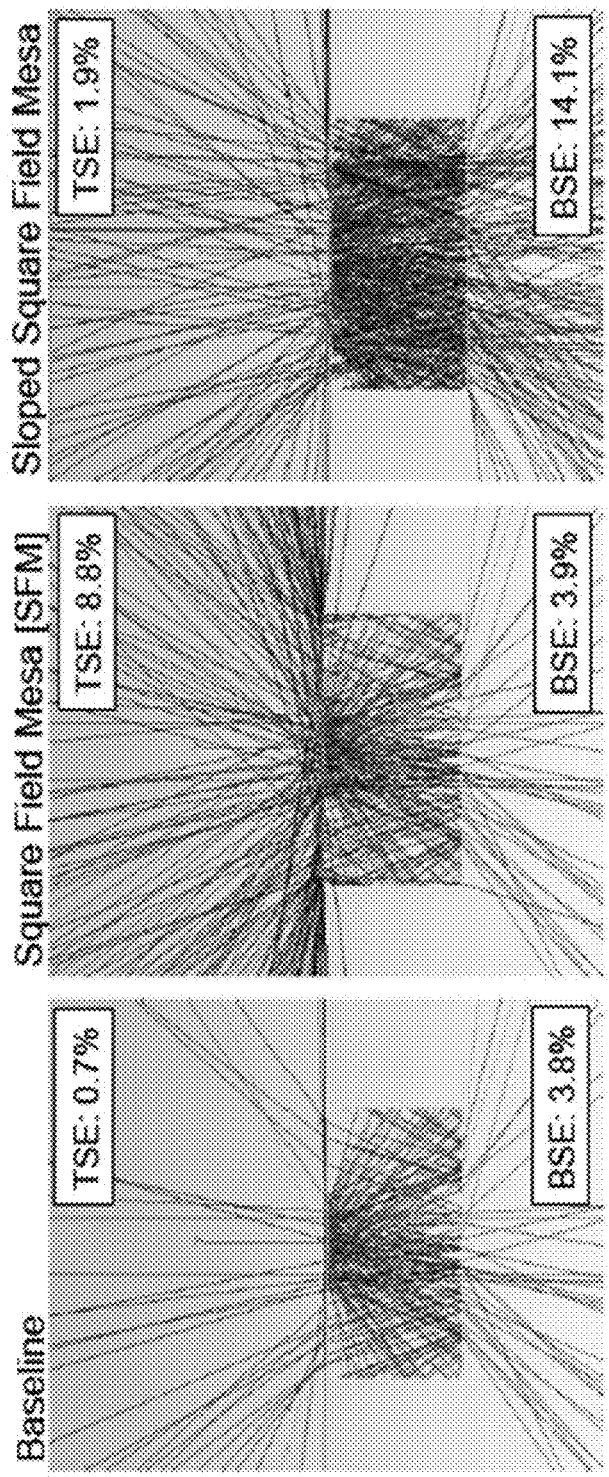
FIG. 4 is illustrates a simulation of various device configurations according to an embodiment of the present invention.

FIG. 3 is a simplified diagram illustrating an LED device according to an alternative embodiment of the present invention. In this embodiment, the relatively small p-n junction area is defined lithographically by removal of most of the p-metal and p-GaN. Further, a relatively small "p-mesa" is defined around this area, through removal of a significant amount of the p-AlGaN and p-n junction, leaving the relatively thick n-AlGaN surface exposed. Referring now to FIG. 4, the attached optical modeling simulation indicates that, in this configuration, only a relatively small amount of the light (~3.8%) is emitted through the back of the Al2O3 substrate, and a very small amount of the light (~0.7%) is emitted on the top, primarily through the exposed side walls of the p-mesa. Modeling indicates that most of the remaining light is trapped in the n-AlGaN layer. However, by etching in a deep sidewall through the thick n-AlGaN, creating a "field mesa", this light can be removed.

As shown, in the first embodiment, the field mesa is a relatively large square shape, with side walls perpendicular to the p-n junction plane. In this case, the light extraction from the top of the chip is increase ~10×, from nearly 0.7% to 8.8%.

In the second embodiment, the field mesa is a relatively large square shape, with side walls at a 45 degree angle to the p-n junction plane. The light moving roughly parallel to the p-n junction plane is guided in the n-AlGaN mesa, to the 45 degree mesa edge, where it is reflected downwards approximately perpendicular to the p-n junction plane, and into the transparent substrate. The light can then be extracted out of the bottom plane of the transparent substrate. In this case, the light extraction from the bottom of the chip is increased ~3.5×, from nearly 3.9% to 14.1%. In a further embodiment [not shown here], light emitting structures could be created in the bottom plane of the transparent substrate, to further enhance the light extraction of the device.

Figure 5:
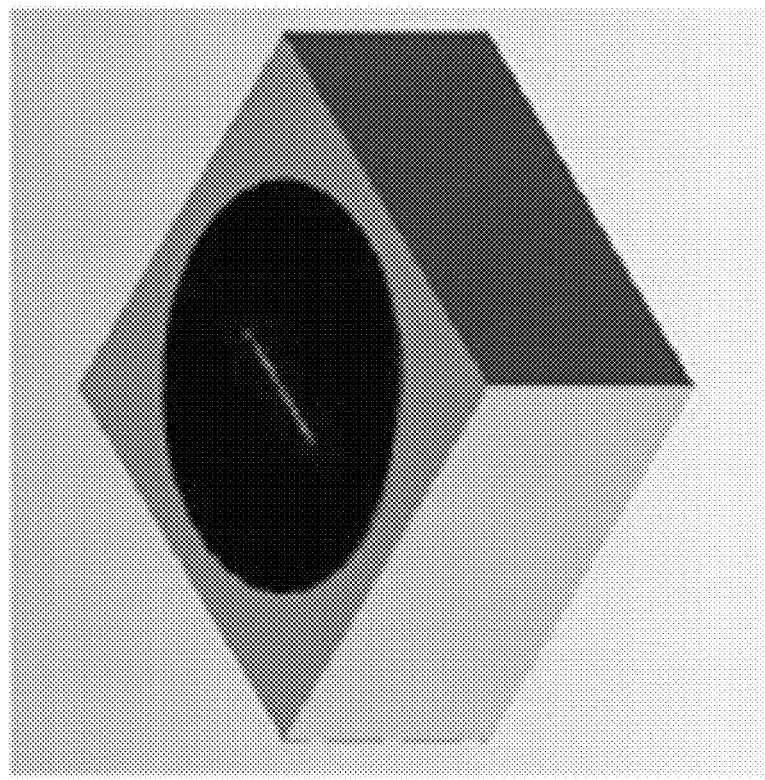
FIG. 5 is a simplified diagram of a LED device according to an embodiment of the present invention.

FIG. 5 is a simplified diagram of a LED device according to an embodiment of the present invention. As shown is an LED device having a circular shaped sloped mesa structure. The circular shaped sloped mesa structure can be configured in various angles, some of which are better for efficiency as compared to others. Further details of the circular shaped structure and related information can be found throughout the present specification and more particularly below.

Figure 6:
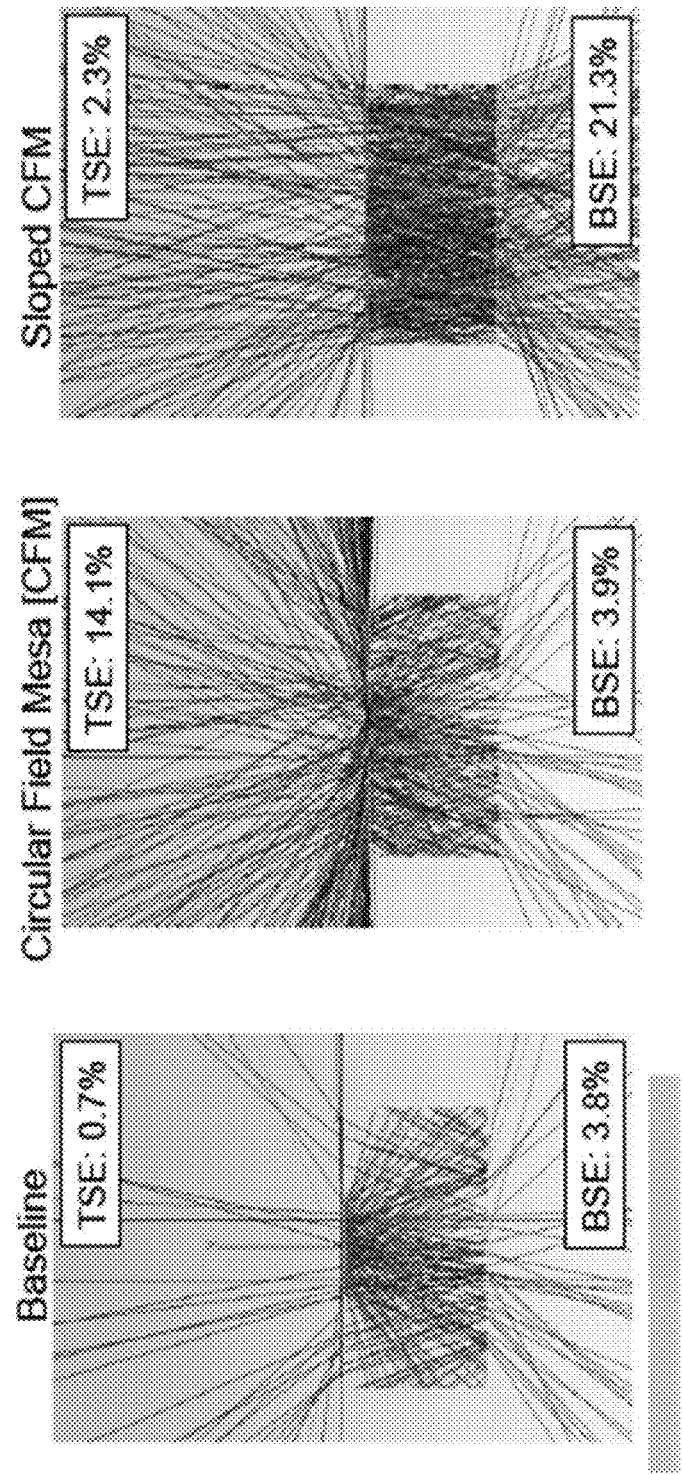
FIG. 6 is illustrates a simulation of various device configurations according to an embodiment of the present invention.

FIG. 6 is illustrates a simulation of various device configurations according to an embodiment of the present invention. As shown, in the a third and forth embodiment, the field mesa is a relatively large circular shape, with side walls at a perpendicular [$3^{rd}$ case] and 45 degree angle [4th case] to the p-n junction plane. These cases are similar to the square field mesa case; however, due to the circular shape of the field mesa, and the relatively small size of the concentrated p-n junction area, the light extraction efficiency is further increased; to 14.1% top side emission in the case of the perpendicular mesa, and 21.3% bottom side emission in the case of the 45 degree message.

Further embodiments [not shown here] could add light extraction elements in the top and/or bottom of the chip to further enhance the light extraction efficiency due to the relatively small size of the p-n junction light creation area.

Figure 7:
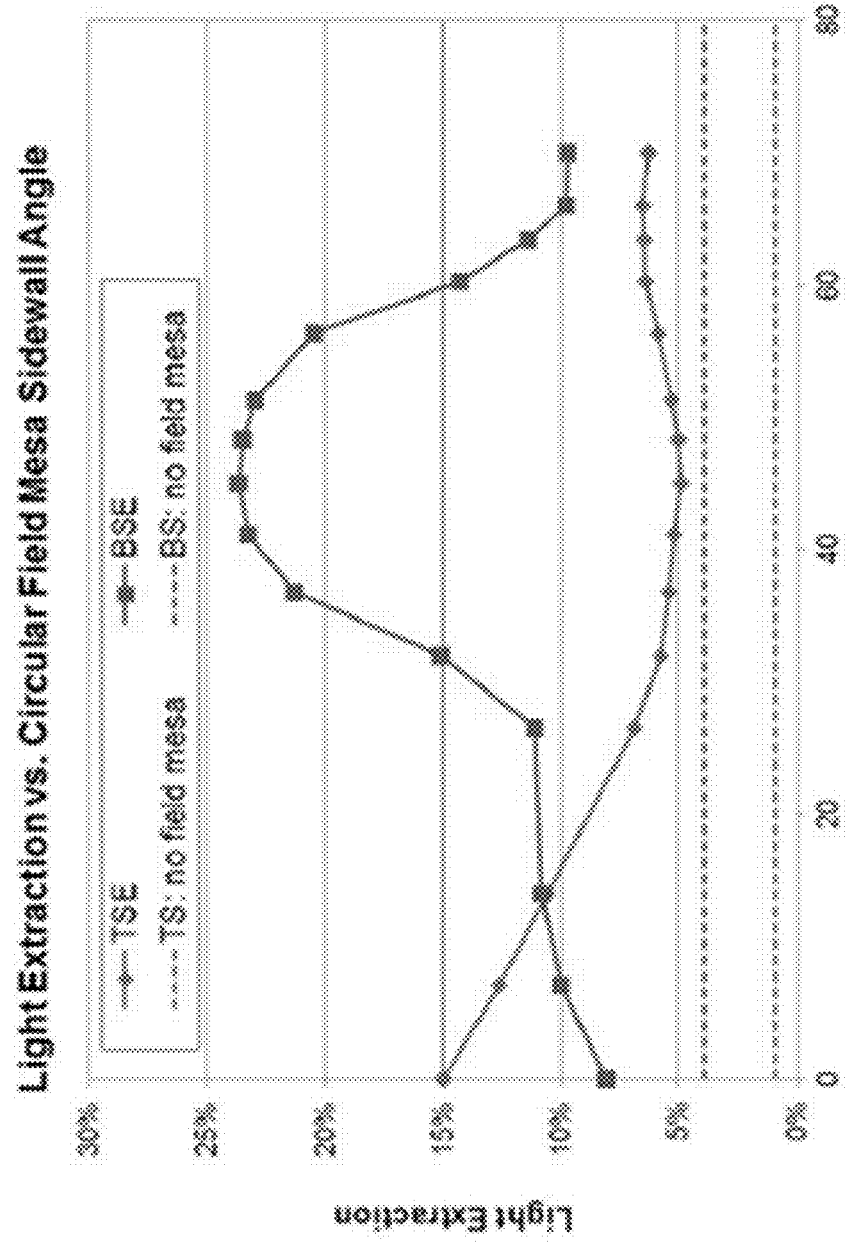
FIG. 7 is a plot of light extraction plotted against slope angle for LED devices according to embodiments of the present invention.

FIG. 7 is a plot of light extraction plotted against slope angle for LED devices according to embodiments of the present invention. As shown is extraction efficiency plotted against various slopes for the circular shaped sloped mesa LED device. As shown in the dotted lines are device structures without any sloped mesa etches, which lack extraction efficiency variations. As shown between the 40 Degrees and 60 Degrees mesa structure, efficiency improves, which is an unexpected benefit. In an example, efficiency improved greater than 2× relative to a base line of 10%, as shown.

In an example, the present device can include one or more of the following elements:
  a) a light emitting region, where light is generated in the device;
  b) an optical cavity, where light can be trapped in the device;
  c) light emission surface(s), where light is extracted from the device;
  d) a light extraction structure, which causes light which is trapped in the optical cavity and is not being directed towards the light emission surface(s), and causes it to change direction towards the light emission surface(s) in such a way that it can be extracted form the device.

In an example, the light emitted is between 200 nm and 365 nm, although there can be variations. In an example, the light emitted is between 240 and 340 nm. In an example, the light extraction structure consists of a sloped sidewall of the optical cavity. In an example, the sloped sidewall is between 25 and 70 degrees relative to the surface normal of the LED chip, that is, the growth direction of the epitaxial material. In an example, the light emission surface is configured with the transparent substrate. In an example, the substrate comprises sapphire or other material. In an example, the semiconductor-air interfaces are additionally roughened in a random or regular pattern to increase light extraction. In an example, internal interfaces between one or more of the semiconducting layers is additionally roughened in a random or regular pattern to increase light extraction. In an example, the interface between the semiconducting layer and the substrate is additionally roughened in a random or regular pattern to increase light extraction. In an example, the optical cavity comprises a compound of AlGaN or others. In an example, the symmetry of the light extraction feature intentionally differs from the symmetry of the light generation region. Of course there can be variations.

Figure 8:
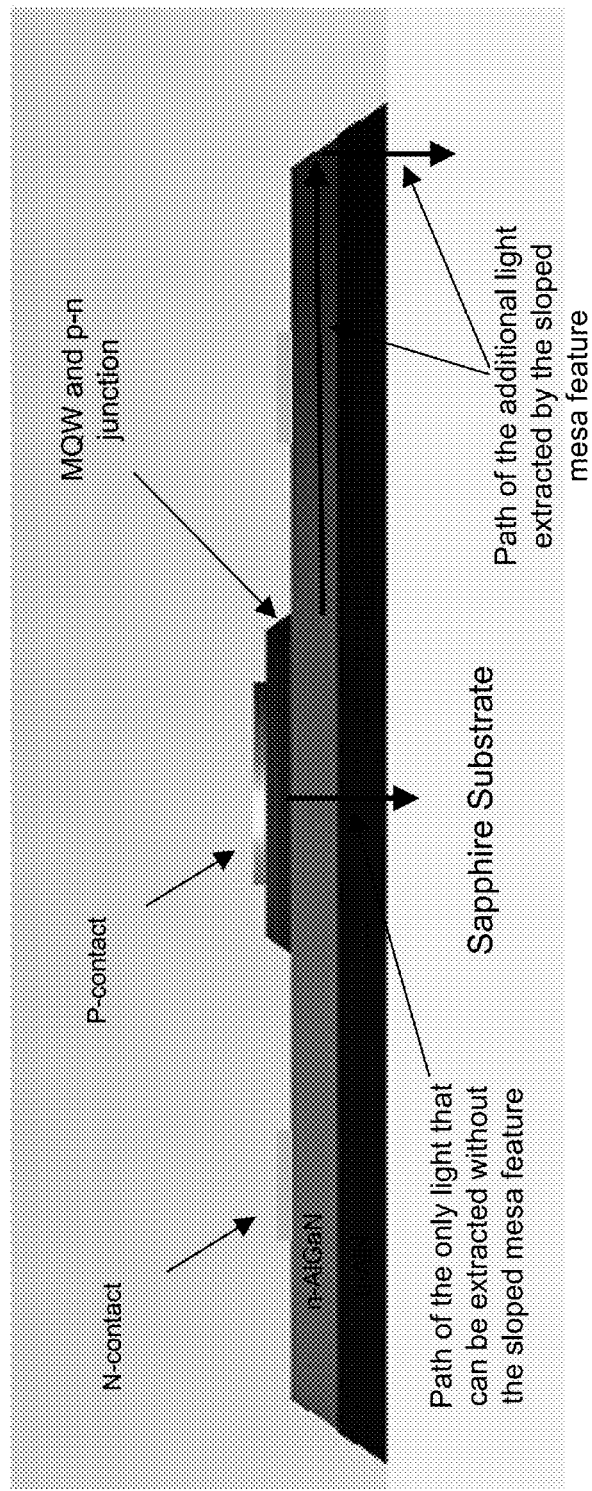
FIG. 8 is a simplified side-view diagram of an LED device having a sloped mesa configuration according to an embodiment of the present invention.

FIG. 8 is a simplified side-view diagram of an LED device having a sloped mesa configuration according to an embodiment of the present invention. In an example, a sloped sidewall on the LED device acts like an angled mirror. In an example, the sloped sidewall turns the laterally traveling light toward the substrate. In an example, light can be extracted out a sapphire substrate, which is the base substrate for the LED device. In an example, an LED device is capable of emitting electromagnetic radiation ranging from about 200 nm to 365 nm, among others. The LED device has a substrate member, the substrate member being selected from sapphire, silicon, quartz, gallium nitride, gallium aluminum nitride, or others. As shown a sapphire substrate that has a surface region. The device has an active region overlying the substrate region. In an example, the active region comprises a light emitting spatial region comprising a p-n junction and characterized by a current crowding feature of electrical current provided in the active region, the light emitting spatial region being characterized by about 1 to 10 microns.

In an example, an optical structure spatially disposed separate and apart the light emitting spatial region and is configured to facilitate light extraction from the active region. As shown, the optical structure is a sloped mesa spatial configuration on edges of the active region (e.g., multi-quantum wells, and p-n junction). In an example, the active region has a spatial area than is not as wide as an underlying n-type epitaxial material, such as n-type AlGaN. The n-type GaN is overlying an aluminum nitride bearing material, which overlies the surface of the sapphire substrate. Edges of the n-type AlGaN and AlN layers are configured as a sloped mesa to cause light traversing laterally through these layers to be reflected back through the sapphire substrate, thereby improving efficiency of the light extraction from the active region. Of course, there can be other variations, modifications, and alternatives.

Figure 9:
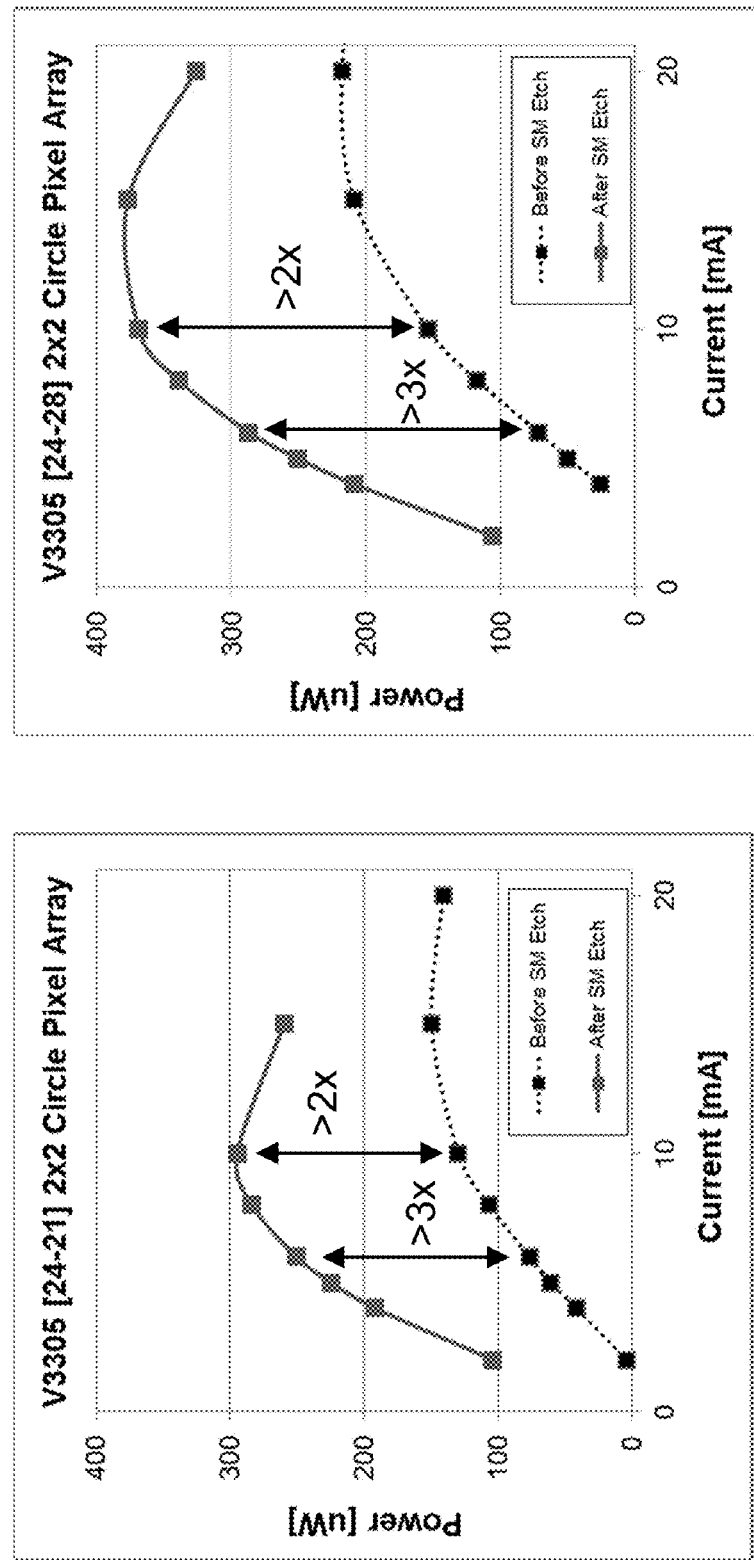
FIGS. 9 and 10 are plots of experimental data of sloped mesa configured LED devices according to embodiments of the present invention.
Figure 10:
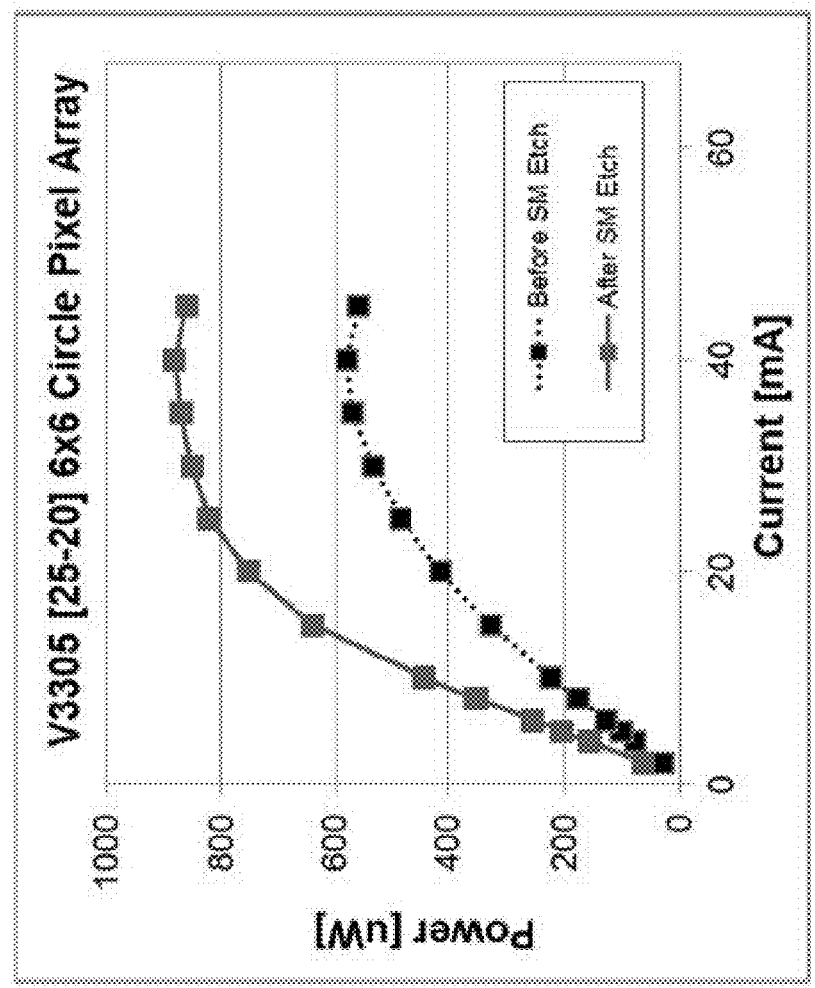

FIGS. 9 and 10 are plots of experimental data of sloped mesa configured LED devices according to embodiments of the present invention. As shown are plots of power against current for three examples. As shown are 2×2 array examples, and a 6×6 array example. Each of the plots illustrates a pair of devices with and without the sloped mesa configuration. As shown, the sloped mesa configuration achieves much higher light extraction, including a 2-3 times efficiency improvement, and at least a 50% increase in efficiency. Of course, these are merely examples, and should not unduly limit the scope of the claims herein.

Figure 11:
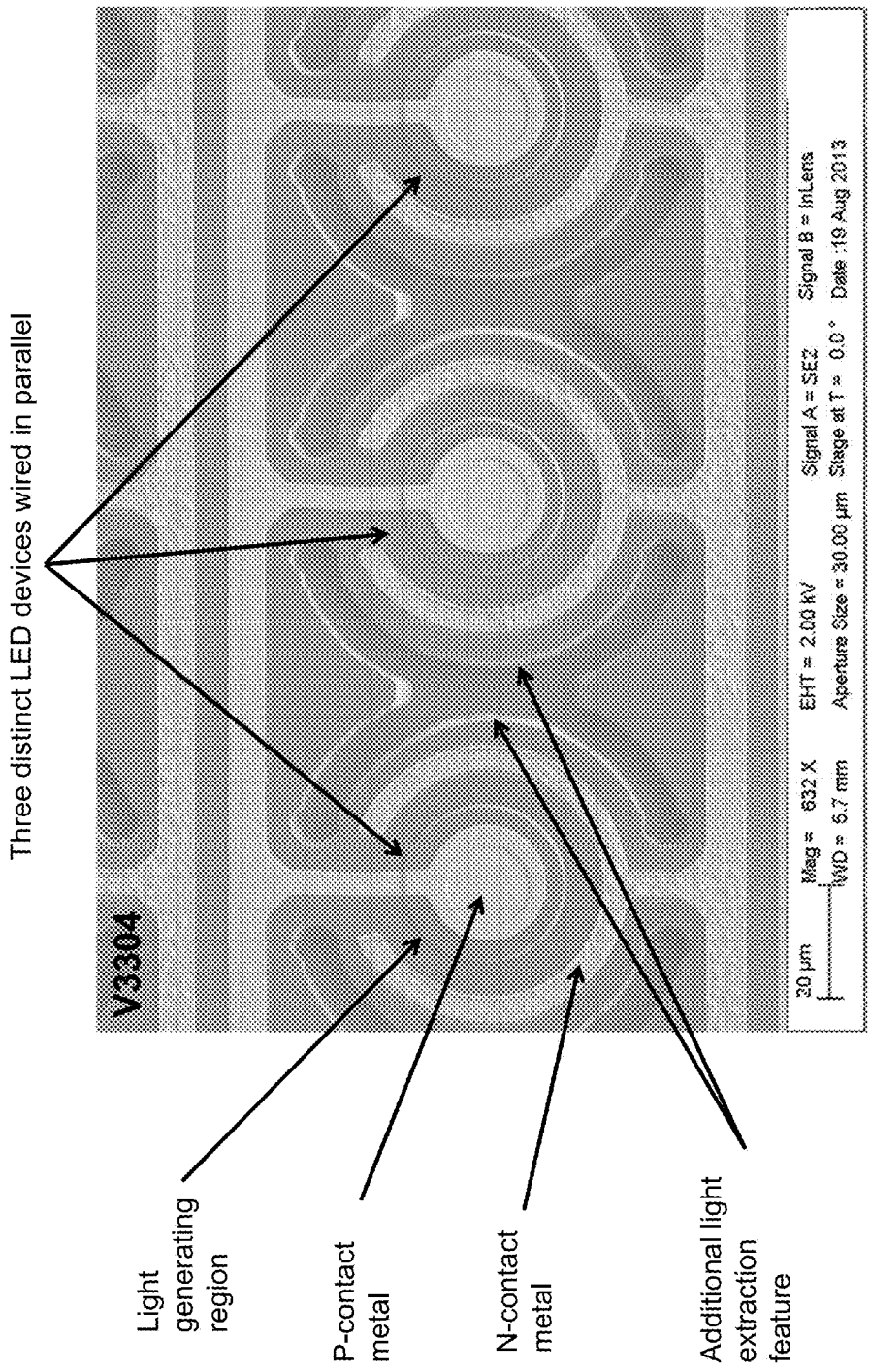
FIG. 11 is a top view illustration of a light extraction feature configured on an LED device according to an embodiment of the present invention.
Figure 12:
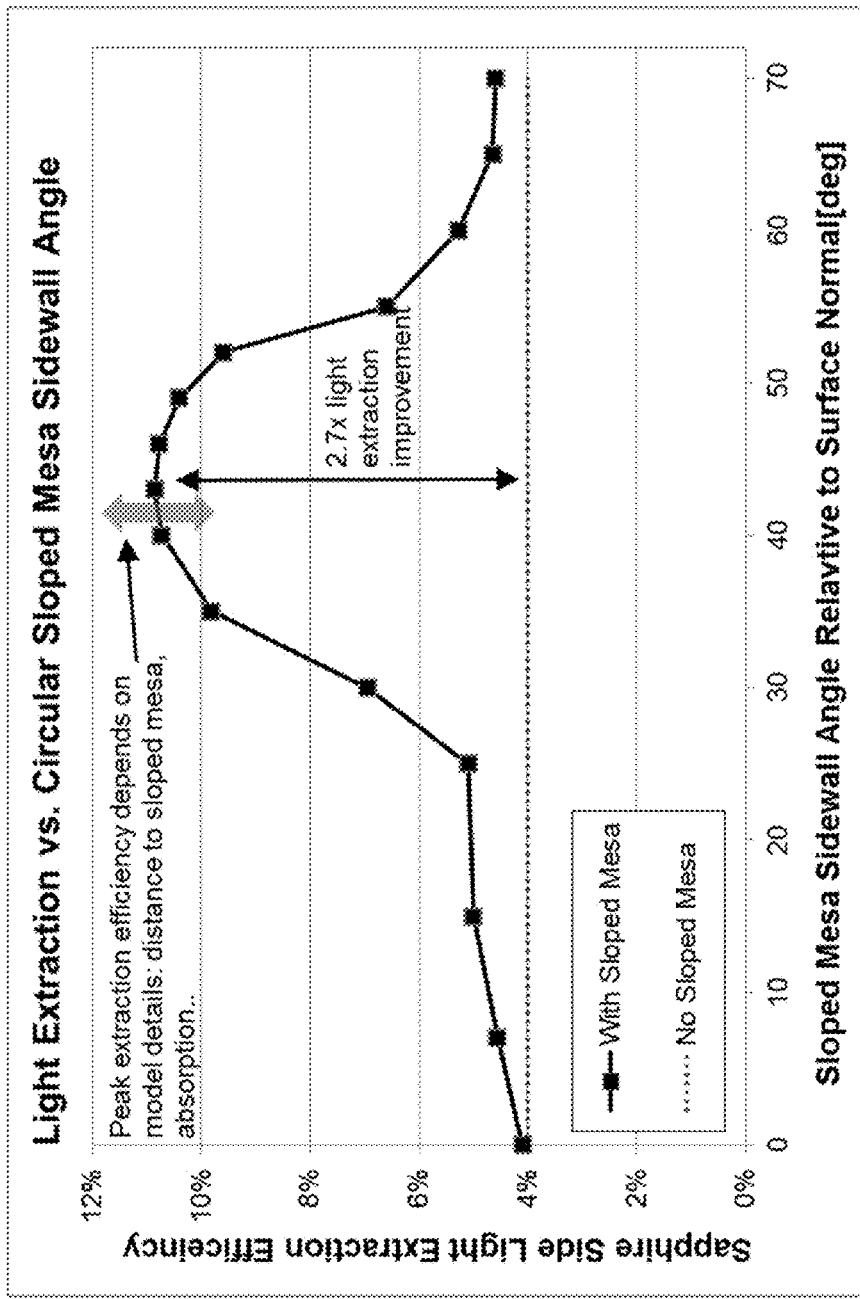
FIG. 12 illustrates a model of an effect of sloped mesa side wall angle-45+/−15 for an LED device according to an embodiment of the present invention.

FIG. 11 is a top view illustration of a light extraction feature configured on an LED device according to an embodiment of the present invention. As shown in the Figure, three LED devices are configured electrically in parallel arrangement. Each of the LED devices includes a p-type contact, an active region, an n-type contact, and a light extraction region, each of which is concentric around the p-type contact region. As shown, the p-type contact region is circular in shape, and is within a diameter of the active region. The active region is within a diameter of the FIG. 12 illustrates a model of an effect of sloped mesa side-wall angle-45+/−15 for an LED device according to an embodiment of the present invention. The illustration plots light extraction efficiency for sapphire plotted against an angle of a sloped slide wall for a circular shaped mesa structure. As shown, the light extraction has a maximum region ranging from about 45+/−15 Degrees, although there can be variations. In an example, the LED device has a circular shaped sloped mesa.

Figure 13:
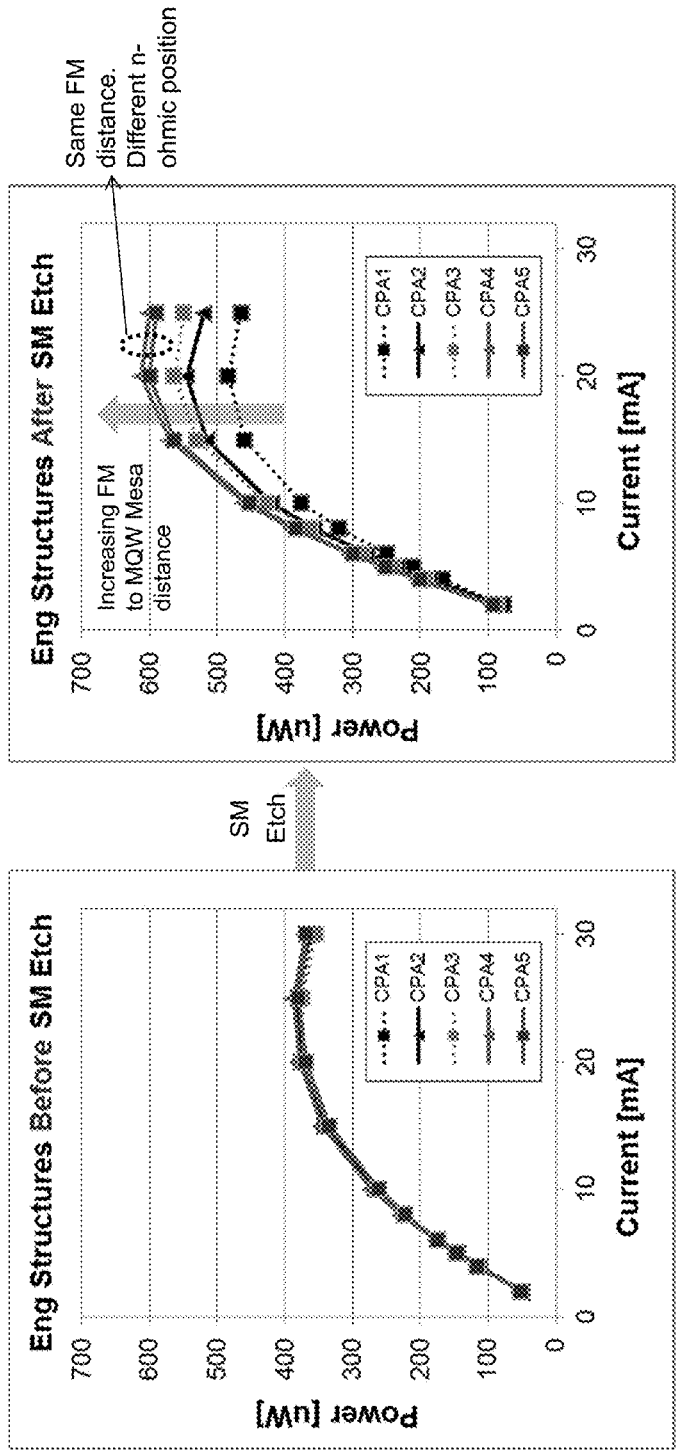
FIG. 13 illustrates data of an effect of sloped mesa to MQW-mesa distance (right after sloped cut) according to an embodiment of the present invention.

FIG. 13 illustrates data of an effect of sloped mesa to MQW-mesa distance (right after sloped cut) according to an embodiment of the present invention. As shown are plots of power against current for the present examples. The left side plot shows structures without sloped etching, and the right side plot shows structures with sloped etching. Of course, these are merely examples, and should not unduly limit the scope of the claims herein.

Figure 14:
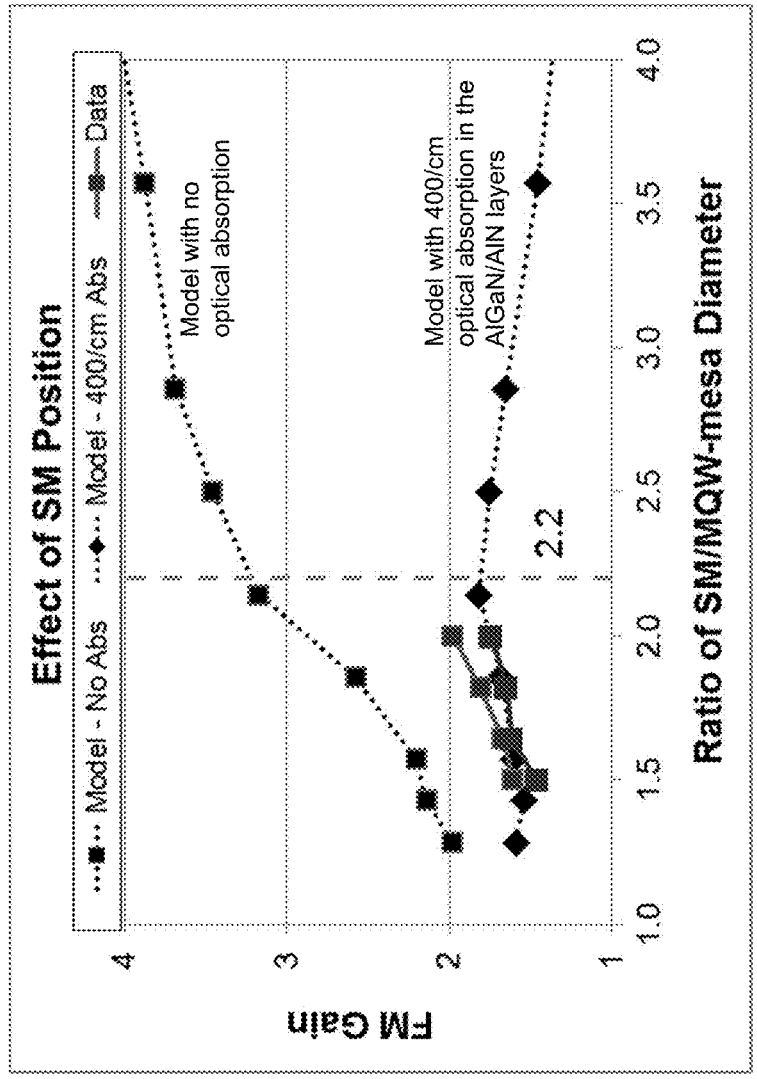
FIG. 14 illustrates a model and data of an effect of sloped mesa to MQW-mesa distance according to an embodiment of the present invention.

FIG. 14 illustrates a model and data of an effect of sloped mesa to MQW-mesa distance according to an embodiment of the present invention.

FIG. 15 illustrates an effect of sloped mesa to MQW-mesa distance according to an embodiment of the present invention. In an example, the illustration shows varying MQW sizes relative to an overlying region, which includes a sapphire surface.

The present invention achieves these benefits and others in the context of known process technology. However, a further understanding of the nature and advantages of the present invention may be realized by reference to the latter portions of the specification and attached drawings.

The invention claimed is:

1. An LED device capable of emitting electromagnetic radiation ranging from about 200 nm to 365 nm, the device comprising:
  a substrate member, the substrate member being selected from sapphire, silicon, quartz, gallium nitride, gallium aluminum nitride, or others;
  an active region overlying the substrate region, the active region comprising a light emitting spatial region comprising a p-n junction and characterized by a current crowding feature of electrical current provided in the active region, the light emitting spatial region being characterized by about 1 to 10 microns;
  an optical structure spatially disposed separate and apart the light emitting spatial region and is configured to facilitate light extraction from the active region.

2. The device of claim 1 wherein the optical structure is about 10 to 100 microns from the p-n junction.

3. The device of claim 1 wherein the p-n junction is smaller in area than the substrate member.

4. The device of claim 1 wherein the optical structure is configured in the substrate, a portion of a nonactive region, and overlying the p-n junction.

5. The device of claim 1 further comprising an n-type region overlying the substrate member.

6. The device of claim 1 further comprising an overlying p-electrode region overlying the p-n junction.

7. The device of claim 1 further comprising an overlying n-electrode region overlying the p-n junction.

8. The device of claim 1 wherein the optical structure is configured as a sloped mesa.

9. The device of claim 1 wherein the optical structure is configured as a lens structure.

10. The device of claim 1 wherein the optical structure is selected from one of a sloped mesa, a sapphire lens, a roughened structure, a patterned substrate, a partially removed portion of the substrate, an integrated optical device provided within a non-active region, or a high index material.

11. The device of claim 1 wherein active region comprising aluminum, gallium, and nitrogen entities.

12. The device of claim 1 wherein the p-n junction has a current density of 1.5 Amps/centimeter$^2$ to 10 Amps/centimeter$^2$.

13. The device of claim 1 wherein the active region is configured as a field region, the field region is configured as a mesa.

14. The device of claim 1 wherein the active region is configured as a square shape, a rectangular shape, an ellipse, a circle, or other closed configuration when viewed a point normal to the p-n junction.

15. An LED device capable of emitting electromagnetic radiation ranging from about 200 nm to 365 nm, the device comprising:
   a substrate member, the substrate member being selected from sapphire, silicon, quartz, gallium nitride, gallium aluminum nitride, or others;
   an active region overlying the substrate region, the active region comprising a light emitting spatial region comprising a p-n junction and characterized by a current crowding feature of electrical current provided in the active region, the light emitting spatial region being characterized by about 1 to 10 microns;
   an optical structure spatially disposed separate and apart the light emitting spatial region and is configured to facilitate light extraction from the active region; wherein the LED device is configured to extract greater than 7 percent to 50 percent of electromagnetic radiation generated within the active region.

16. An LED device capable of emitting electromagnetic radiation ranging from about 200 nm to 365 nm, the device comprising:
   a substrate member, the substrate member being selected from sapphire, silicon, quartz, gallium nitride, gallium aluminum nitride, or others;
   an active region overlying the substrate region, the active region comprising a light emitting spatial region comprising a p-n junction and characterized by a current crowding feature of electrical current provided in the active region, the light emitting spatial region being characterized by about 1 to 10 microns;
   an optical structure spatially disposed separate and apart the light emitting spatial region and is configured to facilitate light extraction from the active region; wherein the LED device is configured to extract greater than 7 percent to 90 percent of electromagnetic radiation generated within the active region.

17. A method for fabricating an LED device capable of emitting electromagnetic radiation ranging from about 200 nm to 365 nm, the method comprising:
   providing a substrate member, the substrate member being selected from sapphire, silicon, quartz, gallium nitride, gallium aluminum nitride, or others;
   forming an active region overlying the substrate region, the active region comprising a light emitting spatial region comprising a p-n junction and characterized by a current crowding feature of electrical current provided in the active region, the light emitting spatial region being characterized by about 1 to 10 microns; and
   forming an optical structure spatially disposed separate and apart the light emitting spatial region and is configured to facilitate light extraction from the active region.

18. The method of claim 17 wherein the optical structure is about 10 to 100 microns from the p-n junction; wherein the forming of the active region comprises growing multiple thicknesses of epitaxial material to form a thickness having a surface region; forming a mask overlying the surface region, while exposing a portion of the surface region; and removing the exposed portion of the thickness such that a remaining structure of a portion of the thickness is narrower than a length of the surface region.

19. The method of claim 17 wherein the p-n junction is smaller in area than the substrate member.

20. The method of claim 17 wherein the optical structure is configured in the substrate, a portion of a nonactive region, and overlying the p-n junction.

21. The method of claim 17 further comprising an n-type region overlying the substrate member.

22. The method of claim 17 further comprising an overlying p-electrode region overlying the p-n junction.

23. The method of claim 17 further comprising an overlying n-electrode region overlying the p-n junction.

24. The method of claim 17 wherein the optical structure is configured as a sloped mesa.

25. The method of claim 17 wherein the optical structure is configured as a lens structure.

26. The method of claim 17 wherein the optical structure is selected from one of a sloped mesa, a sapphire lens, a roughened structure, a patterned substrate, a partially removed portion of the substrate, an integrated optical method provided within a non-active region, or a high index material.

27. The method of claim 17 wherein active region comprising aluminum, gallium, and nitrogen entities.

28. The method of claim 17 wherein the p-n junction has a current density of 1.5 Amps/centimeter$^2$ to 10 Amps/centimeter$^2$.

29. The method of claim 17 wherein the active region is configured as a field region, the field region is configured as a mesa.

30. The method of claim 17 wherein the active region is configured as a square shape, a rectangular shape, an ellipse, a circle, or other closed configuration when viewed a point normal to the p-n junction.

31. A method for fabricating an LED device capable of emitting electromagnetic radiation ranging from about 200 nm to 365 nm, the method comprising:
   providing a substrate member, the substrate member being selected from sapphire, silicon, quartz, gallium nitride, gallium aluminum nitride, or others;
   forming an active region overlying the substrate region, the active region comprising a light emitting spatial region comprising a p-n junction and characterized by a current crowding feature of electrical current provided in the active region, the light emitting spatial region being characterized by about 1 to 10 microns; and
   forming an optical structure spatially disposed separate and apart the light emitting spatial region and is configured to facilitate light extraction from the active region, wherein the LED device is configured to extract greater than 7 percent to 50 percent of electromagnetic radiation generated within the active region.

32. A method for fabricating an LED device capable of emitting electromagnetic radiation ranging from about 200 nm to 365 nm, the method comprising:
   providing a substrate member, the substrate member being selected from sapphire, silicon, quartz, gallium nitride, gallium aluminum nitride, or others;
   forming an active region overlying the substrate region, the active region comprising a light emitting spatial region comprising a p-n junction and characterized by a current crowding feature of electrical current provided in the active region, the light emitting spatial region being characterized by about 1 to 10 microns; and
   forming an optical structure spatially disposed separate and apart the light emitting spatial region and is configured to facilitate light extraction from the active region; wherein the LED device is configured to extract greater than 7 percent to 90 percent of electromagnetic radiation generated within the active region.

* * * * *